(12) United States Patent
Cheng

(10) Patent No.: US 7,807,319 B2
(45) Date of Patent: Oct. 5, 2010

(54) PHOTOMASK INCLUDING CONTRAST ENHANCEMENT LAYER AND METHOD OF MAKING SAME

(75) Inventor: Wen-Hao Cheng, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 665 days.

(21) Appl. No.: 11/729,580

(22) Filed: Mar. 29, 2007

(65) Prior Publication Data

US 2008/0241710 A1    Oct. 2, 2008

(51) Int. Cl.
*G03F 1/00* (2006.01)
(52) U.S. Cl. .......................................................... 430/5
(58) Field of Classification Search .................. 430/5, 430/30, 322
See application file for complete search history.

(56) References Cited

U.S. PATENT DOCUMENTS

| 5,422,205 | A | * | 6/1995 | Inoue et al. | .................... 430/5 |
| 5,965,301 | A | | 10/1999 | Nara | |
| 6,844,235 | B1 | * | 1/2005 | Jones et al. | ................. 438/401 |
| 7,160,651 | B2 | | 1/2007 | Pinkerton | |

\* cited by examiner

*Primary Examiner*—Stephen Rosasco
(74) *Attorney, Agent, or Firm*—Scott M. Lane

(57) ABSTRACT

A photomask and a method of making same. The photomask includes a plate defining transparent regions in a predetermined pattern and opaque regions, the transparent regions adapted to transmit light therethrough; and a contrast enhancement layer disposed over an entire surface of at least one of the transparent regions and the opaque regions.

15 Claims, 5 Drawing Sheets

PHOTOMASK INCLUDING CONTRAST ENHANCEMENT LAYER AND METHOD OF MAKING SAME

FIELD

Embodiments of the present invention relate generally to the field of photomask fabrication for microelectronic processing.

BACKGROUND

In recent years, an increase in integration density in a semiconductor integrated circuit has resulted in an ever-increasing demand for an increase in fineness also in a reticle used in the preparation of this circuit. For example, for DRAM, the line width of a device pattern transferred from a reticle for 16 M DRAM is as small as 0.5 .mu.m. Further, a device pattern of 64 M DRAM requires a resolution of a line width of 0.35 .mu.m. Conventional light exposure systems using a stepper have reached their limit in terms of the ability to provide a further increased fineness.

This inability has led to studies on various methods that can increase the resolution of the device pattern to a level usable for practical use. Among others, a phase shift photomask that uses a conventional stepper exposure system and can increase the resolution of the device pattern transferred from the reticle has attracted attention.

Various phase shift photomasks have been proposed in the art and put to practical use, such as the photomasks shown in each of FIGS. 1a-1c. For the photomask of FIG. 1a, a transparent substrate 102 is provided with depressions 141 in every other space section among space sections between adjacent absorber layer portions 104 to shift a phase of the incoming light, for the photomask shown in FIG. 1a, transparent substrate 102 is engraved to change the phase of exposing light to half-wavelength, and this type of photomask is known as "substrate engraving type." In this case, when a quartz substrate is used as the transparent substrate, the photomask is known as "quartz engraving type." For the photomask of FIG. 1b and 1c, a SiO2 shifter layer 131 is provided onto the transparent substrate 102 to shift a phase of the incoming light. In the case of FIG. 1b, the SiO2 shifter layer 131 is provided between the transparent substrate 102 and absorber layer 104 in every other space section among space sections between adjacent absorber layer portions 104. In the case of FIG. 1c, absorber layer 104 has a repeated pattern and is provided on transparent substrate 102, and a shifter layer 131, which functions to change the phase of the exposing light to half-wavelength, is provided in every other space section among space sections between adjacent absorber layer portions 104. FIG. 1b shows a "Cr on shifter" type photomask wherein a SiO2 shifter layer 131 is provided under the light-shielding layer or absorber layer 104 to change the phase of the exposing light by a half-wavelength. FIG. 1c shows "shifter on Cr" type photomask wherein a SiO2 shifter layer 131 is provided on the top of the light-shielding layer or absorber layer 104 to change the phase of the exposing light by half-wavelength.

However, disadvantageously, prior art photomasks are not able to provide the imaging contrast needed to allow the reliable production microelectronic devices exhibiting densities required for next generation chips.

Figure 1A:
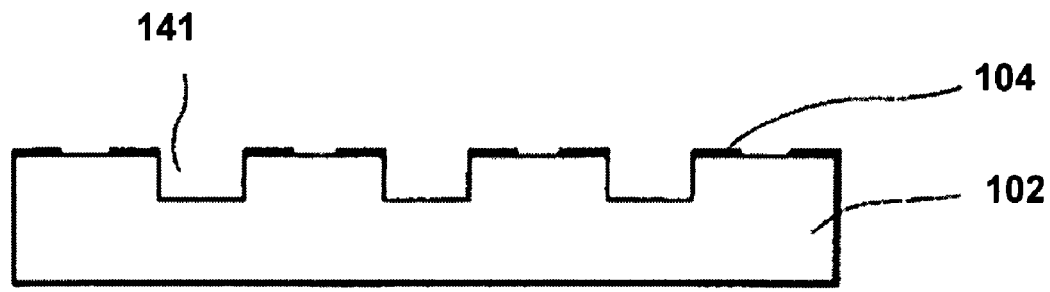
FIG. 1a-1c show configurations for various prior art photomasks.
Figure 1B:
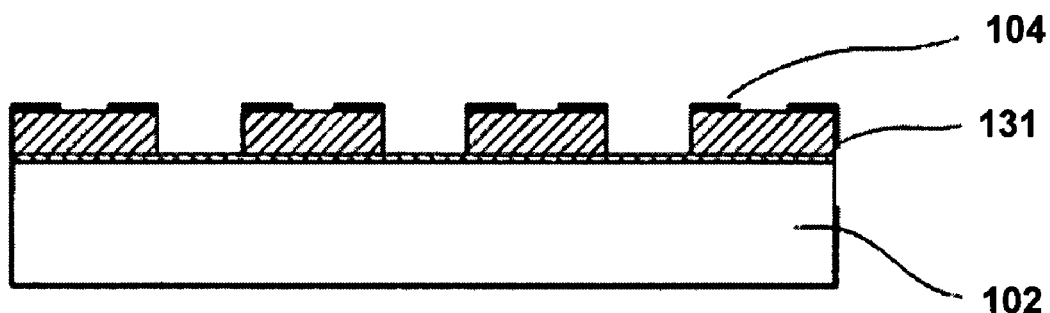
Figure 1C:
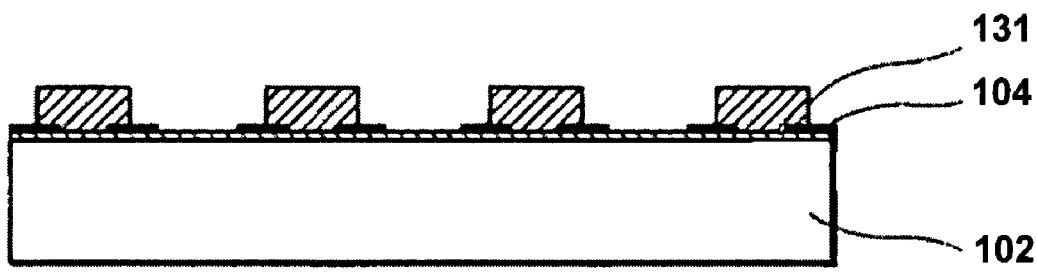

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a method to provide a transistor or memory cell structure is disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one element relative to other elements. As such, a first element disposed on, above, or below a second element may be directly in contact with the second element or it may include one or more intervening elements. In addition, a first element disposed next to or adjacent a second element may be directly in contact with the second element or it may include one or more intervening elements. In addition, in the instant description, figures and/or elements may be referred to in the alternative. In such a case, for example where the description refers to Figs. X/Y showing an element A/B, what is meant is that Fig. X shows element A and Fig. Y shows element B. In addition, a "layer" as used herein may refer to a layer made of a single material, a layer made of a mixture of different components, a layer made of various sub-layers, each sub-layer also having the same definition of layer as set forth above.

Aspects of this and other embodiments will be discussed herein with respect to FIGS. 2a-2d, 3a-3c and 4. The figures, however, should not be taken to be limiting, as it is intended for the purpose of explanation and understanding. The figures are discussed in further detail below.

FIGS. 2a-2d show four embodiments for a configuration of a photomask. FIGS. 2a-2d each show a portion of a photomask 200 including plate 201 which defines transparent regions 203 (only one of which is shown in FIGS. 2a-2d, it being understood that only a portion of a photomask 200 is shown in those figures—photomask 200 in effect comprising a repetition of each of the patterns shown in respective ones of FIGS. 2a-2d) in a predetermined pattern adapted to transmit light therethrough, and opaque regions 205. Additionally, as shown in FIGS. 2a-2d, the photomask includes a Contrast Enhancement Layer for Lithography or CELL layer 208 disposed over an entire surface of at least one of the transparent regions 203 on the one hand and the opaque regions 205 on the other hand. In other words, according to embodiments, such as, for example, in each of the embodiments of FIGS. 2a-2d, a CELL layer covers either an entire surface of the transparent regions 203, or an entire surface of the opaque regions 205, or both the entire surface of the transparent regions 203 and of the opaque regions 205. A function of the CELL layer is to enhance imaging contrast through the photomask as will be explained in further detail below. According to embodiments, the CELL layer may be provided according to any one of well known methods, such as, for example, by way of sputtering or etch patterning. The materials of CELL may be tuned and selected according to embodiments to target to what is needed for imaging performance optimization for a given design layout. Examples of CELL materials are SiO2 and any chemical and optical tuned SiON materials.

In the shown embodiments of FIGS. 2a-2d, the plate 201 includes a transparent layer 202 adapted to transmit light therethrough, and an absorber layer 204 disposed on the transparent layer 202. As shown in FIGS. 2a-2d, the absorber layer 204 defines openings 210 (only one of which is shown in FIGS. 2a-2d) therethrough according a predetermined pattern as a function of a pattern to be developed by way of lithography through the photomask. In the shown embodiments of FIGS. 2a-2d, the transparent regions 203 of the plate 201 correspond to regions of the transparent layer 202 exposed through the openings 210, and the opaque regions 205 of the plate 201 correspond to regions of the transparent layer 202 covered by the absorber layer 204. According to an embodiment, the transparent layer 202 may comprise a quartz layer, and the absorber layer 204 may comprise a chromium or any other opaque material layer. FIGS. 2a-2d additionally show an anti-reflection coating on the absorber layer 204, although it is understood that embodiments are not so limited.

Figure 2A:
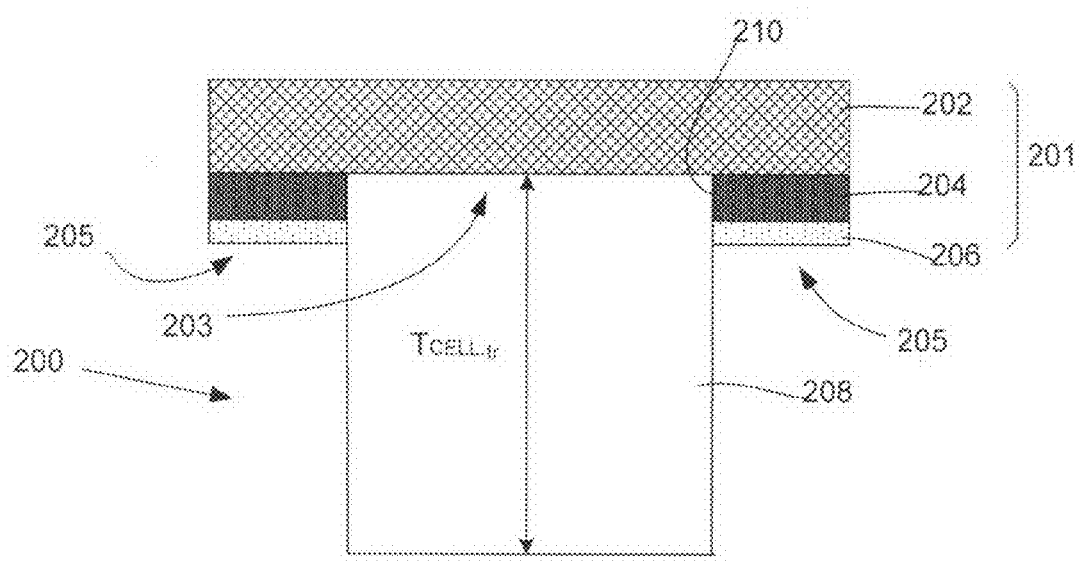
FIGS. 2a-2d show respective first to fourth configurations for a photomask according to embodiments.
Figure 2B:
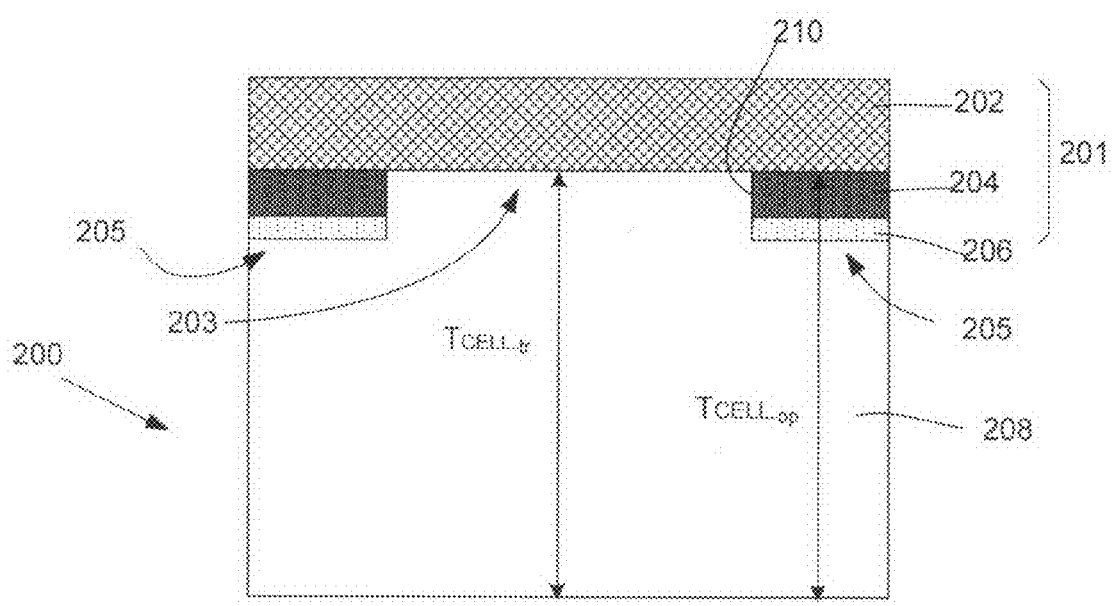
Figure 2C:
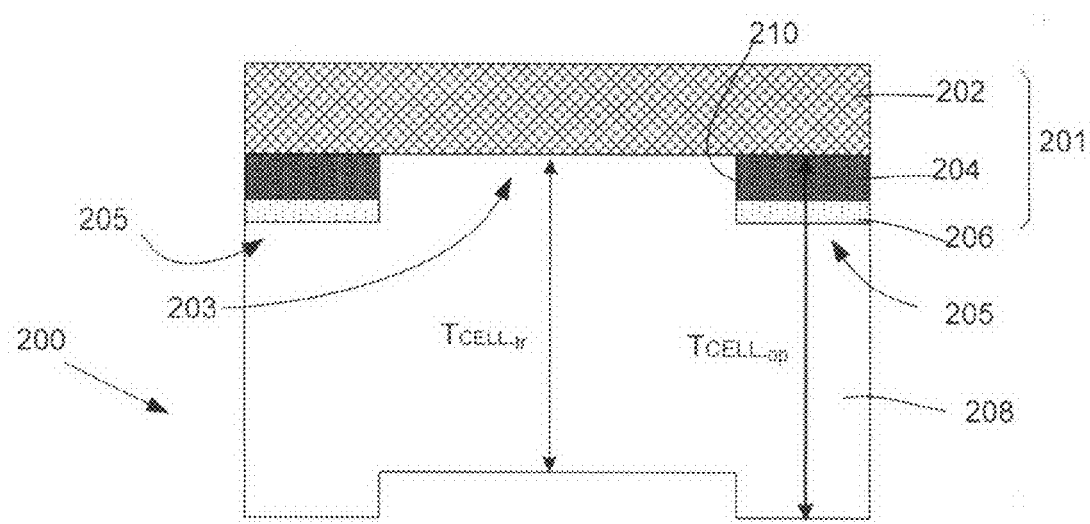
Figure 2D:
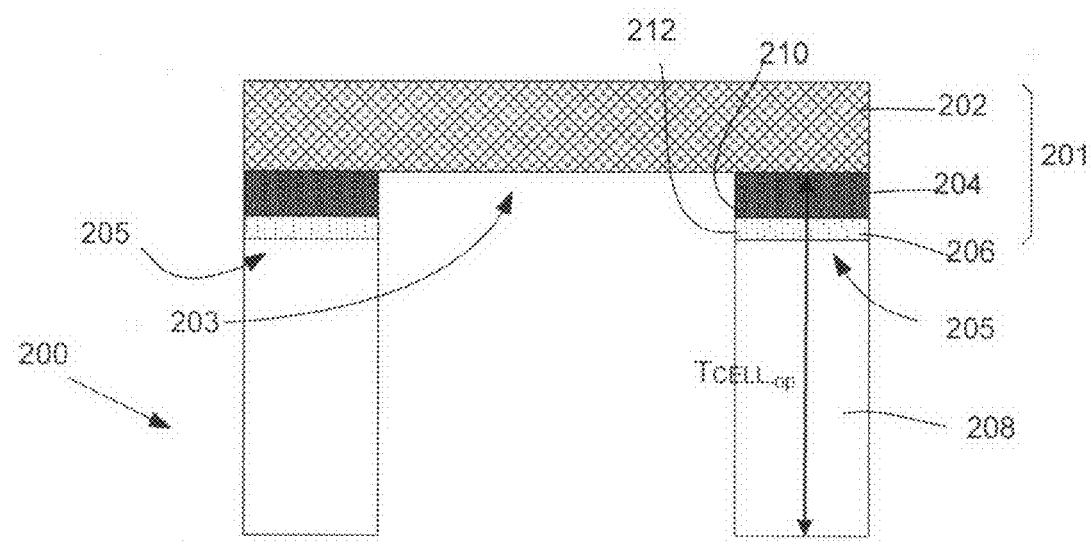

Referring to the embodiment of FIG. 2a, the CELL layer 204 is shown as having been disposed on entire surface of the transparent regions 203. In the shown embodiment, the CELL layer presents a constant thickness $T_{CELL-tr}$ over the surface of the transparent regions 203. The configuration as shown in the embodiment of FIG. 2a may be referred to as a "mesa mask." Referring next to the embodiments of FIGS. 2b and 2c, the CELL layer is shown as presenting a first thickness $T_{CELL-tr}$ on the transparent regions 203 and a second thickness $T_{CELL-op}$ on the opaque regions 205. In the embodiment of FIG. 2b, the thicknesses $T_{CELL-tr}$ and $T_{CELL-op}$ are such that the CELL layer presents a flat surface at a side thereof opposite the plate 201. A flat surface of the CELL layer as noted above may, for example be obtained by way of polishing in a well known manner. The configuration as shown in the embodiment of FIG. 2b may be referred to as a "flat top mask." In the embodiment of FIG. 2c, the thicknesses $T_{CELL-tr}$ and $T_{CELL-op}$ are such that the CELL layer presents a stepped surface at a side thereof opposite the plate 201, and further such that the portion of the CELL layer covering the transparent regions 203 presents a depression with respect to the portion of the CELL layer covering the opaque regions. It is also possible according to embodiments to have a photomask where the portion of the CELL layer covering the opaque regions 205 presents a depression with respect to the portion of the CELL layer covering the transparent regions 203. The configuration as shown in the embodiment of FIG. 2c may be referred to as a "topographic mask." Referring next to FIG. 2d, the CELL layer is shown as having been disposed only over an entire surface of the opaque regions 205, the CELL layer presenting a thickness $T_{CELL-op}$ on the absorber layer 204. The configuration shown in the embodiment of FIG. 2d may be referred to as a "patterned layer mask," as the CELL layer therein presents a pattern of openings 212 which matches the pattern of openings 220 of the absorber layer 204.

According to embodiments, a thickness of the CELL layer at each location of the photomask, such as, for example, at each of the transparent regions on the one hand or the opaque regions on the other hand, is adapted to provide an enhanced contrast through the photomask during lithography as compared with use of the photomask without the CELL layer. Preferably, a thickness of the CELL layer at each location of the photomask is adapted to provide a maximum contrast through the photomask during lithography for similar illumination conditions. An exemplary determination of the thickness of the CELL layer at each location of the photomask (including a determination of topography) for a given set of illumination conditions will be explained in further detail with respect to FIGS. 3a-3c below. The values in FIGS. 3a-3c were obtained by way of simulation using commercially available software by the name of "Panoramic" using a Finite Difference Time Domain Electro Magnetic solver, as would be recognized by one skilled in the art.

Figure 3A:
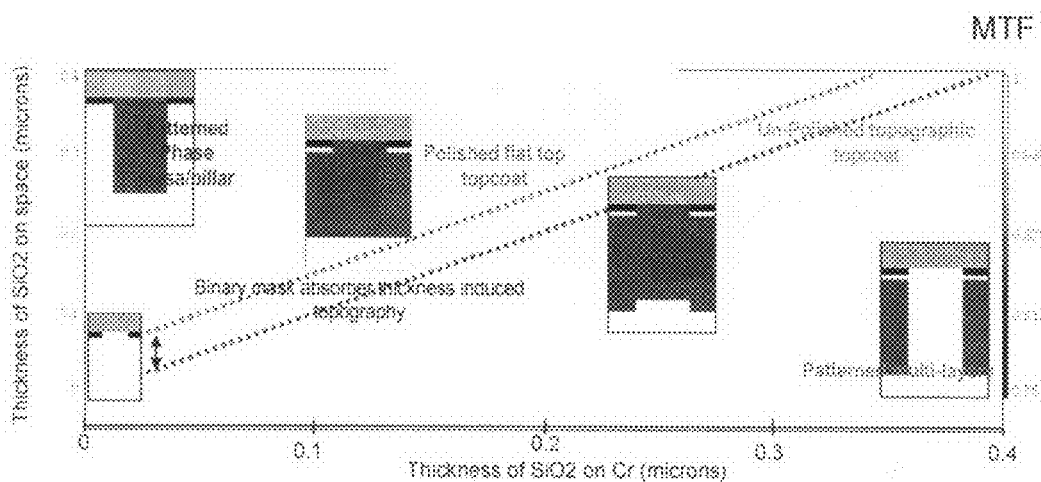
FIG. 3a shows the photomask configurations of FIGS. 2a-2d on a graph plotting a Contrast Enhancement Layer for Lithography (CELL) including SiO2, with thickness on transparent regions of the photomask versus CELL thickness on opaque regions of the photomask.

Referring now to FIG. 3a, a graph is shown plotting, in dotted lines a relationship between $T_{CELL-op}$ and $T_{CELL-tr}$ in microns for a flat top mask (such as the one shown in FIG. 2(b) and for a topographic mask (such as the one shown in FIG. 2(c)) (where the masks include a CELL layer including SiO2 according to one embodiment), and further depicting various configurations of the photomask at various locations of the graph corresponding to the stated thicknesses on the x and y axes. The coordinates depicted at the right of the graph in FIG. 3a correspond to Modulation Transfer Function, or MTF, which is well known as representing contrast. The MTF coordinate axis in FIG. 3a is in fact applicable only to FIG. 3b and the illumination conditions applicable thereto as will be explained in further detail below. However, the MTF coordinate axis has been also depicted in FIG. 3a to suggest the close relationship between the graphs in FIGS. 3a and 3b, respectively.

Figure 3B:
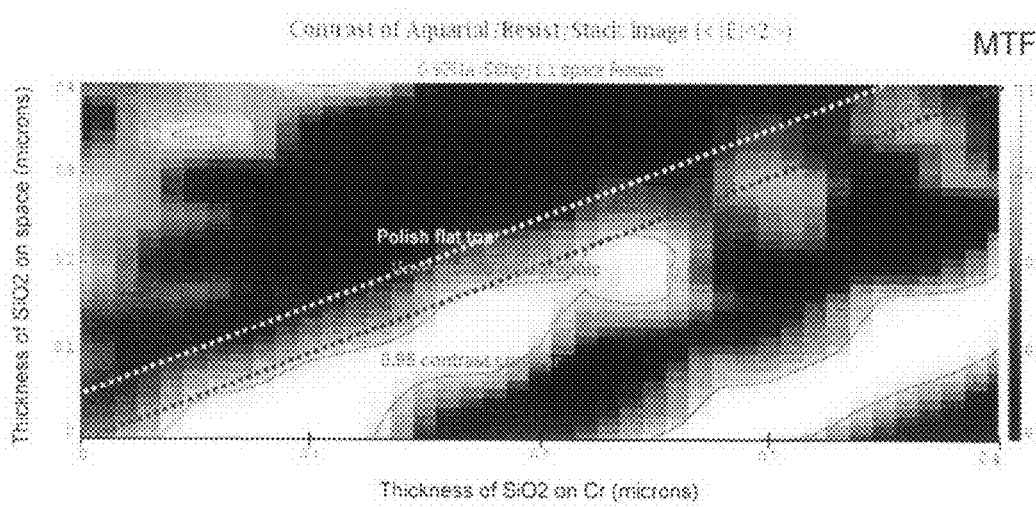
FIG. 3b shows Modulation Transfer Function (MTF), i.e., imaging contrast, values projected onto the graph of FIG. 3a for predetermined illumination conditions.

Referring now to FIG. 3b, a graph is shown similar to the graph in FIG. 3a, plotting the same values for $T_{CELL-tr}$ and $T_{CELL-op}$ against one another, but further depicting MTF values by way of shading according to the legend for MTF as shown on the MTF axis at the right of FIG. 3b. The values for MTF in FIG. 3b are for illumination conditions involving polarized dipole illumination of a mask with a numerical aperture NA of 0.93, for a half pitch (hp) of 58 nm dense 1:1 line-and-space features imaging after 4× image reduction on wafer plane As suggested by the shading on the MTF axis, the brightest regions of the graph corresponds to respective thicknesses $T_{CELL-tr}$ and $T_{CELL-op}$ which present the highest contrast for the illumination conditions noted above. Thus, as suggested in FIG. 3a, a thickness of the CELL layer at each location of the photomask, such as, for example, $T_{CELL-tr}$ and $T_{CELL-op}$ as shown in FIGS. 2a-2d may adapted to provide an enhanced contrast through the photomask during lithography as compared with use of the photomask without the CELL layer, by choosing a region on the graph corresponding to an enhanced MTF as compared with the region of the graph where both $T_{CELL-tr}$ and $T_{CELL-op}$ are equal to zero. In such a case, values for $T_{CELL-tr}$ and $T_{CELL-op}$ may be obtained from FIG. 3a by correlating regions of enhanced MTF with $T_{CELL-tr}$ and $T_{CELL-op}$ values on the x and y axes, respectively.

Preferably, a thickness of the CELL layer at each location of the photomask may be adapted to provide a maximum contrast through the photomask during lithography for similar illumination conditions, for example by choosing a region on the graph which corresponds to an MTF value of 1, or to one of the brightest regions on the graph of FIG. 3b. In such a case, values for $T_{CELL\text{-}tr}$ and $T_{CELL\text{-}op}$ may be obtained from FIG. 3a by correlating regions of maximum MTF with $T_{CELL\text{-}tr}$ and $T_{CEL\text{-}op}$ values on the x and y axes, respectively.

Figure 3C:
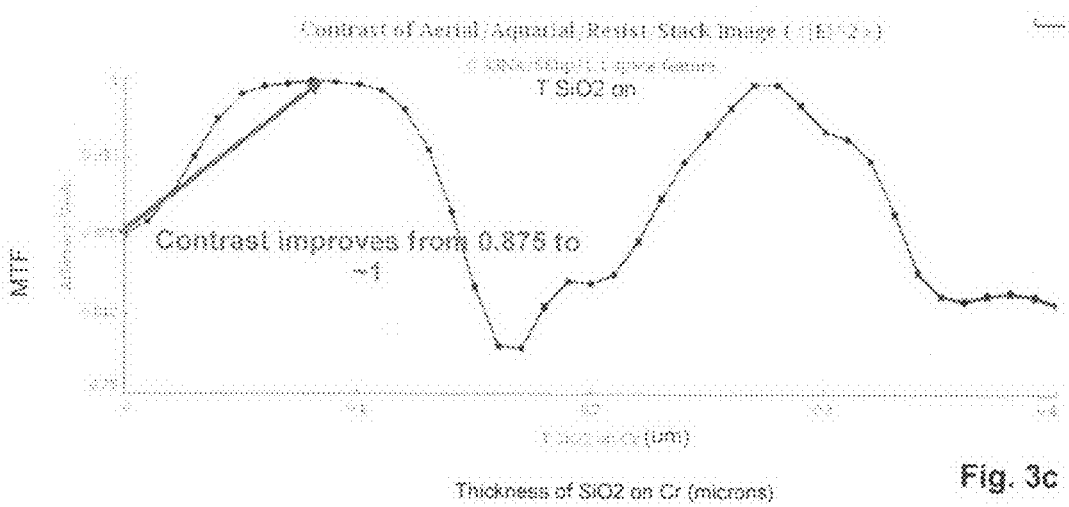
FIG. 3c shows and a graph plotting MTF versus CELL thickness on opaque regions as shown in FIG. 3b for a condition where CELL thickness on transparent regions is equal to zero.

Referring next to the graph of FIG. 3c, an example of MTF versus $T_{CELL\text{-}op}$ is shown as taken from the graph of FIG. 3b for a photomask where $T_{CELL\text{-}tr}=0$. Such a mask would correspond to the embodiment of FIG. 2(d) which represents a patterned layer mask. In the graph of FIG. 3c, MTF is shown in the y axis, and the x axis corresponds to the x axis of either of FIG. 3a or 3b. As clearly seen in FIG. 3c, MTF or contrast improves from 0.875 to almost 1 by increasing $T_{CELL\text{-}op}$ from 0 to about 0.1 micron. The maximum MTF regions in FIG. 3c correspond to the brightest regions of FIG. 3b on the x axis for the situation where $T_{CELL\text{-}tr}=0$ (patterned layer mask) throughout. Additionally, it is noted that, although for the illumination conditions of FIG. 3b, a maximum MTF is not possible for a mesa mask where $T_{CELL\text{-}op}=0$, a change in the illumination conditions could allow the use of a mesa mask that provides maximum contrast.

It is noted that embodiments are not limited to the use of a binary photomask as depicted in FIGS. 2a-2d, but include within their scope the use of CELL on any photomask plate including transparent regions and opaque regions as would be within the knowledge of one skilled in the art. In addition, embodiments are also not limited to an CELL layer which has a constant thickness $T_{CELL\text{-}tr}$ on the transparent regions, and a constant thickness $T_{CELL\text{-}op}$ on the opaque regions, but include within their scope an CELL layer where the thickness $T_{CELL\text{-}tr}$ and/or the thickness $T_{CELL\text{-}op}$ vary across a surface of respective ones of the transparent regions and the opaque regions according to application needs.

Figure 4:
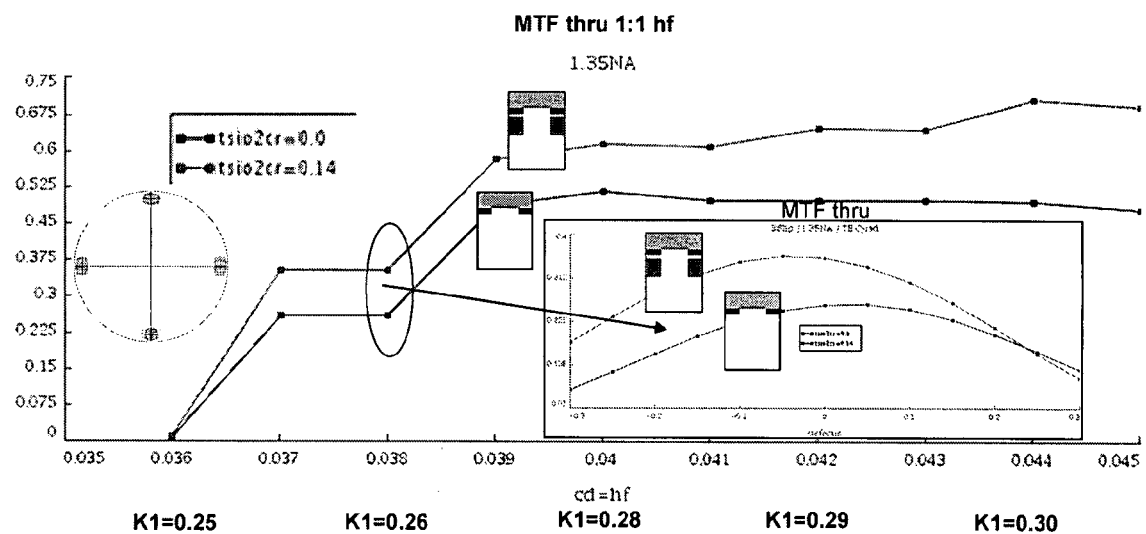
FIG. 4 shows a graph plotting MTF versus half pitch for the photomask embodiment of FIG. 2d including SiO2 and for a photomask embodiment of the prior art.

FIG. 4 provides an example of MTF versus half pitch (hf) or critical dimension (cd), or versus the corresponding value K1, where K1=half-pitch×NA/Lambda, where NA is Numerical Aperture of the projection optical system being used, and Lambda is the wavelength of illumination. The illumination conditions in FIG. 4 include quadruple illumination with NA=1.35, the optical limit corresponding to K1=0.25, at which point the MTF is equal to zero. The top curve in FIG. 4 corresponds to a patterned layer mask (according to FIG. 2d), where $T_{CELL\text{-}op}=0.14$ micron, while the bottom curve in FIG. 4 corresponds to a photomask without a CELL layer. As clearly suggested in FIG. 4, the provision of a CELL layer according to an embodiment can improve contrast through pitches for a given illumination condition. According to the inlay figure within FIG. 4, which corresponds to a graph of MTF versus defocus from the best imaging contrast point for the illumination conditions of the main graph in FIG. 4, and for a half pitch of 0.038. Here, the inlay figure within FIG. 4 clearly suggests that the addition of a CELL layer according to an embodiment improves MTF for a given illumination condition and half pitch across various defocus values.

Advantageously, by virtue of the provision of a CELL layer on a photomask plate, embodiments allow a balancing of the $0^{th}$ and $1^{st}$ diffraction beams' amplitudes and phases through an optimal thickness of the CELL layer, and thus optimize imaging contrast for lithographic process window improvement. Thus, a CELL layer according to embodiments enables pitch shrink for transistor density and thus chip functional improvement, while at the same time allowing the use of existing lithographic tools. Embodiments advantageously allow an optimization of the thickness of the CELL layer on different locations of the photomask plate for diffraction beam balancing, normalized image log slope enhancement and contrast enhancement. Providing a CELL layer on a photomask plate provides a degree of freedom as a control knob to enhance the optical lithographic processing window. Where the CELL layer is provided on both the transparent regions and the opaque regions, it effectively advantageously provides a solid immersion mask. According to simulation results, a patterned layer mask including an opaque absorber layer and CELL pillars on the absorber layer may provide the best configuration in achieving contrast enhancement as compared with other configurations discussed herein.

The various embodiments described above have been presented by way of example and not by way of limitation. Having thus described in detail embodiments of the present invention, it is understood that the invention defined by the appended claims is not to be limited by particular details set forth in the above description, as many variations thereof are possible.

What is claimed is:

1. A photomask comprising:
   a plate defining transparent regions in a predetermined pattern and opaque regions, the transparent regions adapted to transmit light therethrough; and
   a contrast enhancement layer disposed over an entire surface of at least one of the transparent regions and the opaque regions.

2. The photomask of claim 1, wherein the plate comprises:
   a transparent layer adapted to transmit light therethrough;
   an absorber layer disposed on the transparent layer, the absorber layer defining openings therethrough according to the predetermined pattern, the transparent regions of the plate correspond to regions of the transparent layer exposed through the openings, and the opaque regions of the plate corresponding to regions of the transparent layer covered by the absorber layer.

3. The photomask of claim 2, wherein the transparent layer comprises quartz, and the absorber layer comprises chromium.

4. The photomask of claim 2, wherein the contrast enhancement layer is disposed only over an entire surface of the opaque regions.

5. The photomask of claim 2, wherein the contrast enhancement layer is disposed only over an entire surface of the transparent regions.

6. The photomask of claim 2, wherein the contrast enhancement layer is disposed over an entire surface of both the transparent regions and the absorber regions.

7. The photomask of claim 6, wherein the contrast enhancement layer has a first thickness on the transparent regions, and a second thickness on the opaque regions.

8. The photomask of claim 7, wherein the contrast enhancement layer includes one of a flat surface and a stepped surface.

9. The photomask of claim 7, wherein the contrast enhancement comprises SiO2.

10. The photomask of claim 1, wherein a thickness of the contrast enhancement layer at each location of the photomask is adapted to provide an enhanced contrast through the photomask during lithography as compared with use of the photomask without the contrast enhancement layer.

11. The photomask of claim 9, wherein a thickness of the contrast enhancement layer at each location of the photomask is adapted to provide a maximum contrast through the photomask during lithography for predetermined illumination conditions.

12. The photomask of claim 1, wherein a thickness of the contrast enhancement layer at each location of the photomask is about 120 nm.

13. The photomask of claim 1, wherein a thickness of the contrast enhancement layer at each location of the photomask is adapted to provide a predetermined contrast through the photomask during lithography.

14. A method of making a photomask comprising:
provinding a plate defining transparent regions in a predetermined pattern and opaque regions, the transparent regions adapted to transmit light therethrough; and
providing a contrast enhancement layer over an entire surface of at least one of the transparent regions and the opaque regions.

15. The method of claim 14, further comprising:
providing a transparent layer adapted to transmit light therethrough;
providing an absorber layer disposed on the transparent layer, the absorber layer defining a pattern, the absorber layer defining openings therein according to the predetermined pattern, the transparent regions of the plate correspond to regions of the transparent layer exposed through the openings, and the opaque regions of the plate corresponding to regions of the transparent layer covered by the absorber layer.

* * * * *